United States Patent [19]

Mizutani

[11] Patent Number: 5,236,546
[45] Date of Patent: Aug. 17, 1993

[54] PROCESS FOR PRODUCING CRYSTAL ARTICLE

[75] Inventor: Hidemasa Mizutani, Sagamihara, Japan

[73] Assignee: Canon Kabushiki Kaisha, Tokyo, Japan

[21] Appl. No.: 806,788

[22] Filed: Dec. 12, 1991

Related U.S. Application Data

[63] Continuation of Ser. No. 551,659, Jul. 11, 1990, abandoned, which is a continuation of Ser. No. 146,725, Jan. 21, 1988, abandoned.

[30] Foreign Application Priority Data

Jan. 26, 1987 [JP] Japan .................. 62-14103

[51] Int. Cl.$^5$ ............................ C30B 13/00
[52] U.S. Cl. .................. 156/620.71; 156/620.7; 156/620.73; 156/DIG. 64; 156/DIG. 73; 156/DIG. 111; 437/83
[58] Field of Search .......... 156/610, 612, 613, 614, 156/DIG. 64, DIG. 99, DIG. 111, 620.7, 620.73, 620.71, DIG. 73; 437/62, 67, 68, 83, 90, 238, 241, 946; 148/DIG. 50, DIG. 114, DIG. 152

[56] References Cited

U.S. PATENT DOCUMENTS

| | | | |
|---|---|---|---|
| 3,620,833 | 11/1971 | Gleim et al. | 437/83 |
| 3,634,150 | 1/1972 | Horn | 156/613 |
| 4,069,094 | 1/1978 | Shaw et al. | 156/613 |
| 4,141,765 | 2/1979 | Druminski et al. | 156/612 |
| 4,279,688 | 7/1981 | Abrahams et al. | 156/613 |
| 4,578,142 | 3/1986 | Corboy, Jr. et al. | 156/612 |
| 5,010,033 | 4/1991 | Tokunaga et al. | 437/83 |

OTHER PUBLICATIONS

Filby et al. "Single-Crystal Films of Silicon on Insulators" Brit. J. Appl. Phys. vol. 18, 1967 pp. 1357–1382.
"Epitaxial Growth" Part A, by J. W. Matthews, pp. 12, 21, 413 and 428 (1975).
Ogawa et al., "The Selective Epitaxial Growth of Silicon by Using Silicon Nitride Film as a Mask", Jap. J. Appl. Phys. vol. 10, No. 12 (1971), pp. 1675–1679.
Claassen et al., "The Nucleation of CVD Silicon on $SiO_2$ and $Si_3N_4$ Substrates", J. Electrochem. Soc., vol. 127, No. 1 (1980), pp. 194–202.
Jastrzebski, "SOI by CVD: Epitaxial Lateral Overgrowth (ELO) Process-Review", J. Crys. Growth 63 (1983) pp. 493–526.

*Primary Examiner*—R. Bruce Breneman
*Attorney, Agent, or Firm*—Fitzpatrick, Cella, Harper & Scinto

[57] ABSTRACT

A process for producing a crystal article comprises the steps of: forming on a substrate surface a layer (S) comprising a different material (S) providing a nucleation density of the crystal nucleus to be formed sufficiently smaller than the amorphous material (L) constituting the substrate surface, forming an opening on said layer (S) so that the exposed portion of said substrate surface may have an area sufficiently small to the extent that a single crystal may grow only from the single crystal nucleus formed, permitting a single crystal to grow on the exposed portion of the substrate surface at said opening with the single crystal nucleus as the center, and flattening the surface of the grown single crystal by removing a part thereof.

1 Claim, 8 Drawing Sheets

PROCESS FOR PRODUCING CRYSTAL ARTICLE

This application is a continuation of application Ser. No. 07/551,659 filed Jul. 11, 1990, now abandoned, which is a continuation of application Ser. No. 146,725 filed on Jan. 21, 1988, now abandoned.

BACKGROUND OF THE INVENTION

1. Field of the Invention

This invention relates to a process for producing a crystal article.

The present invention can be suitably used for, for example, SOI technique.

2. Related Background Art

In the prior art, the single crystalline thin film to be used for semiconductor electronic device, photoelectric device, etc. has been formed by epitaxial growth on a single crystalline substrate. However, for epitaxial growth of a single crystalline thin film on a single crystalline substrate, it is necessary to take matching in lattice constant and coefficient of thermal expansion between the single crystalline material of the substrate and the epitaxial growth layer, and there has been involved the problem that the kinds of the substrate material were limited to extremely narrow scope for formation of a single crystalline layer capable of preparing a device of good quality.

On the other hand, in recent years, research and development have been actively done about three-dimensional integrated circuits for accomplishing high integration and multi-functionality by forming semiconductors by lamination in the direction normal to the substrate, and also research and development about a large area semiconductor device such as a solar battery in which elements are arranged in an array on an inexpensive glass or switching transistor of liquid crystal picture elements, etc. are becoming more active year by year.

What is common in these researches and developments, the technique to form a semiconductor film on an amorphous insulating material and form an electronic element such as transistor, etc. thereon is required. Among them, it has been particularly desired to have a technique to form a single crystalline semiconductor of high quality on an amorphous insulating material.

However, generally speaking, when a thin film is formed on an amorphous insulating substrate such as $SiO_2$, etc., due to deficiency of long length order of the substrate material, the crystal structure of the deposited film becomes amorphous or polycrystalline, whereby it was very difficult to form a single crystalline semiconductor of high quality. Here, amorphous film refers to one with the state in which short length order to the minimum extent on the order of atom may be maintained, but there is no longer length order, while polycrystalline film refers to one in which single crystal grains having no specific crystal direction are gathered as separated with grain boundaries.

As a solution of the problems as mentioned above in the prior art, European Patent Application EP 244081 A1 proposes a method for forming a crystal by permitting a single crystal to grow on the single nucleus as the growing center, on the nucleation surface ($S_{NDL}$) provided on a substrate surface which is constituted of a material sufficiently larger in nucleation density (ND) than the material constituting said substrate surface and has an area sufficiently small to the extent that only a single crystal can be grown, and by use of this method, it is shown possible to form a single crystal also on an insulating amorphous substrate.

In the invention described in the above European Patent Application, when the material of different kind constituting the nucleation surface ($S_{NDL}$) is smaller in etching speed than the material constituting the substrate surface, it is difficult to effect etching selectively and form the nucleation surface ($S_{NDL}$) with good precision, and therefore improvement in this respect has been desired.

SUMMARY OF THE INVENTION

An object of the present invention is to provide a process for producing a crystal article in which a single crystal region of high quality can be formed according to simple steps and with high precision.

Another object of the present invention is to provide a process for producing a crystal article comprising the steps of:

forming on a substrate surface a layer (S) comprising a different material (S) providing a nucleation density of the crystal nucleus to be formed sufficiently smaller than the amorphous material (L) constituting the substrate surface.

forming an opening on said layer (S) so that the exposed portion of said substrate surface may have an area sufficiently small to the extent that a single crystal may grow only from the single crystal nucleus formed, permitting a single crystal to grow on the exposed portion of the substrate surface at said opening with the single crystal nucleus as the center, and flattening the surface of the grown single crystal by removing a part thereof.

DESCRIPTION OF THE PREFERRED EMBODIMENTS

Referring now to the accompanying drawings, the embodiments of the present invention are described in detail.

FIG. 1 is a schematic diagram of the steps for illustration of an embodiment of the process for producing the crystal article of the present invention.

Figure 1A:
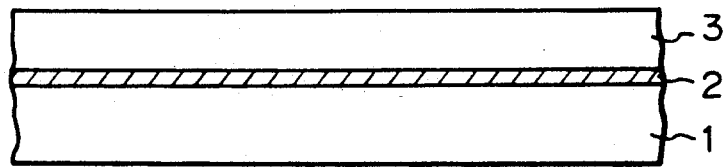
FIGS. 1(A)-1(E) are schematic diagrams of the steps for illustration of an embodiment of the process for producing the crystal article according to the present invention.

First, as shown in FIG. 1(A), a film 2 comprising silicon nitride ($Si_3N_4$), etc. is formed on a substrate 1 such as of glass, etc. by the CVD method, etc, and further a film 3 comprising $SiO_2$, etc. is formed thereon according to the CVD method or the spin coating method, etc.

Figure 1B:
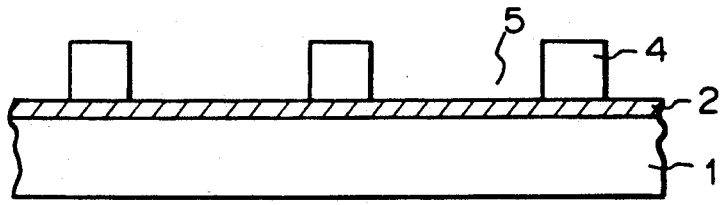

Next, as shown in FIG. 1(B), concavities 5 are formed by selective etching to have only the side wall portions 4 remained. When the film 2 is constituted of $Si_3N_4$, selective etching can be effected by use of, for example, a buffer hydrofluoric acid as the etchant, whereby the film 2 can be remained.

Figure 1C:
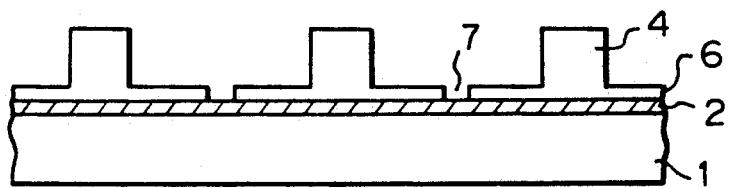

Next, as shown in FIG. 1(C), by oxidation of the glass substrate 1 at a high temperature, a film 6 comprising $SiO_2$ is formed on the surface of the film 2. At this time, the $SiO_2$ film of the side wall portion 4 is also annealed to become dense. Next, by use of the photolithography technique, the small regions at the center of the thin $SiO_2$ film 6 are removed by etching to form small exposed regions 7 of $Si_3N_4$ film. The areas of the small exposed regions 7 are formed sufficiently finely for growth of only a single nucleus of Si which is subjected to crystal growth.

Figure 1D:
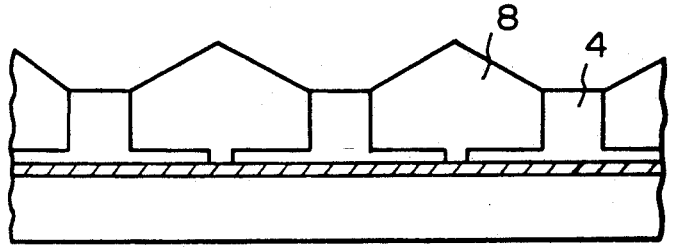

Next, as shown in FIG. 1(D), with the single nucleus of Si formed on the fine exposed region 7 as the center, a single crystal region 8 of Si is formed. At this time, a facet having the spire inherent in single crystal frequently exists to make the surface convex, and therefore the surface is flattened by mechanical polishing.

Figure 1E:
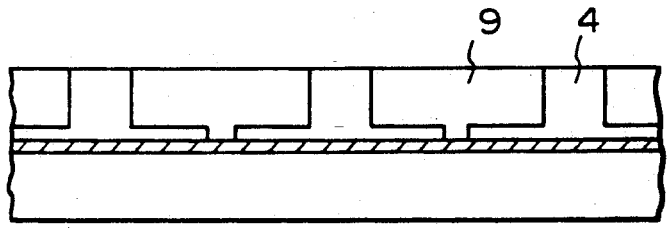

That is, as shown in FIG. 1(E), single crystal regions 9 are formed by flattening the above convexity to provide a crystal article.

According to the process for producing the single crystal of the present invention, by forming a layer comprising a material with small nucleation density and etching the material layer with small nucleation density as contrary to the practice in the prior art, the substrate surface is exposed and a nucleation surface ($S_{NDL}$) with small area is formed such that a single crystal may grow only from the single nucleus which becomes the center of crystal growth, and therefore materials which could not be used due to restriction with respect to combination of materials on account of difference in etching speed, the etching method, etc. can be used.

Also, the process for producing the crystal article of the present invention provides an opening by etching to make a nucleation surface ($S_{NDL}$) at which the center of crystal growth becomes only a single nucleus, and therefore the etching area can be reduced to greater extend than in the prior art process in which the material portion constituting the nucleation surface ($S_{NDL}$) for forming a single crystal which becomes the center of crystal growth are formed by etching.

In the above embodiment, the case of a single crystal has been shown as the crystal, but it is also possible to form a polycrystalline film by arranging the nucleation surfaces ($S_{NDL}$) at appropriate intervals and permitting single crystals growing from the nucleation surfaces to grow to the extent that they are connected to each other.

Figure 2:
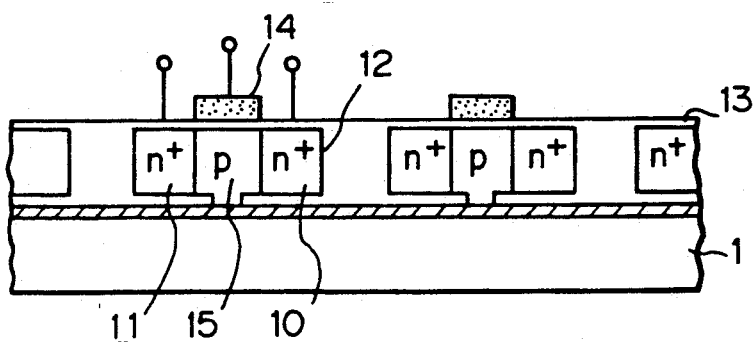
FIG. 2 is a schematic sectional view of the MOS type transistor using the crystal article according to the present invention.

FIG. 2 is a schematic sectional view of the MOS type transistor using the crystal article according to the present invention.

In FIG. 2, 15 is a P-type semiconductor region, which can be formed by doping with a P-type impurity during formation of the single crystal in the production step shown in FIG. 1. 11 and 10 are N-type semiconductor regions, forming source and drain, respectively. 13 is the gate oxide film formed on the P-type semiconductor region 15 and N-type semiconductor regions 11 and 10, and 14 is the gate electrode formed on the gate oxide film 13.

Since the MOS type transistor produced according to the present invention has already the $SiO_2$ layer as the side wall portion formed thereon, it is not necessary to introduce the separation process of the respective transistors, with the respective transistors being completely separated with insulating layers, and therefore it has the advantage of being free from latch-up or $\alpha$-ray disorder.

The production steps of the MOS type transistor are omitted here, because it can be formed according to conventional semiconductor process.

Next, the single crystal growth method for permitting a single crystal silicon to grow at the concavity 5 on the substrate 1 is to be described in detail. As such single crystal growth method, one of the methods as disclosed in the above European Patent Application can be employed. First, for better understanding of such single crystal growth method, general thin film forming process of a metal or a semiconductor is to be explained.

When the deposition surface is of a material different in kind from the flying atoms, particularly an amorphous material, the flying atoms will be freely diffused on the substrate or reevaporated (eliminated). And, as the result of collision mutually between the atoms, a nucleus is formed, and when the nucleus reaches the size rc ($= -2\sigma_0/gv$) at which its free energy G becomes the maximum (critical nucleus), G is reduced and the nucleus continues to grow three-dimensionally and becomes shaped in an island. The nucleus with a size exceeding rc is called "stable nucleus" and in the basic description of the present invention hereinbelow, "nucleus" unless otherwise specifically noted indicates the "stable nucleus".

Also, of the "stable nucleus", one with small r is called "initial nucleus". The free energy G formed by formation of the nucleus is represented by:

$$G = 4\pi f(\theta)(\sigma_0 r^2 + \tfrac{1}{3} g v r^3)$$

$$f(\theta) = \tfrac{1}{4}(2 - 3\cos\theta + \cos^2\theta)$$

where
r: radius of curvature of nucleus
$\theta$: contact angle of nucleus
gv: free energy per unit deposition
$\sigma_0$: surface energy between nucelus and vacuum.

Figure 3:
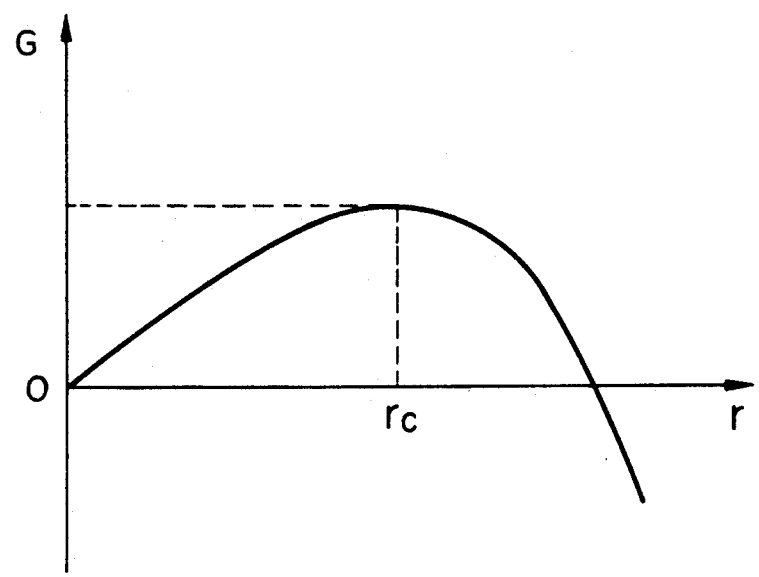
FIG. 3 is a graph showing the manner in which the free energy G of nucleus varies.

The manner in which G varies is shown in FIG. 3. In FIG. 3, the curvature of radius of the stable nucleus when G is at the maximum value is rc.

Thus, the nucleus grows to become shaped in an island, and further grows until contact mutually between islands proceeds, giving rise to coalescence in some cases, finally forming via a network structure a continuous film to cover completely the substrate surface. Through such process, a thin film is deposited on the substrate.

In the deposition process as described above, the density of the nucleus formed per unit area of the substrate surface, the size of the nucleus and the nucleation speed are determined depending on the state of the system of deposition, and particularly the interaction between the flying atoms and the substrate surface substance is an important factor. Also, a specific crystal direction grows in parallel to the substrate depending on the anisotropy relative to the crystal face of the interfacial energy at the interface between the deposited substance and the substrate, and when the substrate is amorphous, the crystal directions within the substrate plane are not constant. For this reason, a grain boundary is formed by collision mutually between nuclei or islands. Particularly, collision mutually between islands with certain sizes or greater, coalescence will occur, leading directly to formation of a grain boundary. The grain boundary formed can be migrated with difficulty in the solid phase, and therefore the grain size is determined at that point.

Next, the selective deposition method for forming selectively a deposited film on the deposition surface is to be described. The selective deposition method is a method in which a thin film is selectively formed on the substrate by utilizing the difference between the materials in the factors influencing nucleation in the thin film forming process such as surface energy, attachment coefficient, elimination coefficient, surface diffusion speed, etc.

Figure 4:
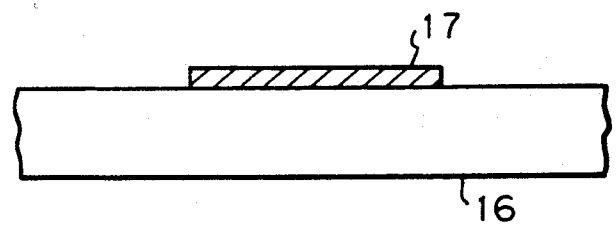
FIGS. 4(A) and 4(B) are diagrams for illustration of the selective deposition method.
Figure 4:
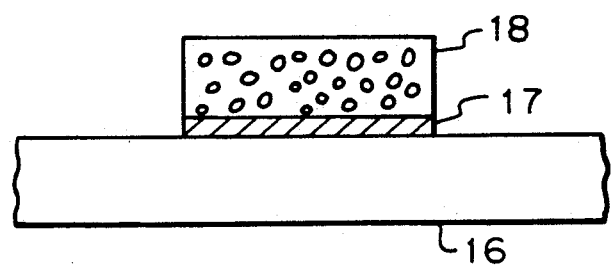

FIGS. 4(A) and 4(B) illustrate schematically the selective deposition method. First, as shown in FIG. 4(A), on the substrate 16, a thin film 17 of a material different in the above factors from the substrate 16 is formed at a desired portion. And, when deposition of a thin film comprising an appropriate material is performed according to appropriate deposition conditions, it becomes possible to cause a phenomenon to occur such that the thin film 18 will grow only on the thin film 17 without growth on the substrate 16. By utilizing this phenomenon, the thin film 18 formed self-matchingly can be permitted to grow, whereby the lithography step by use of a resist as practiced in the prior art can be omitted.

As the materials which can be deposited by such selective formation method, there may be included, for example, $SiO_2$ as the substrate 16, Si, GaAs or silicon nitride as the thin film 17, and Si, W, GaAs, InP, etc. as the thin film 18 to be deposited.

Figure 5:
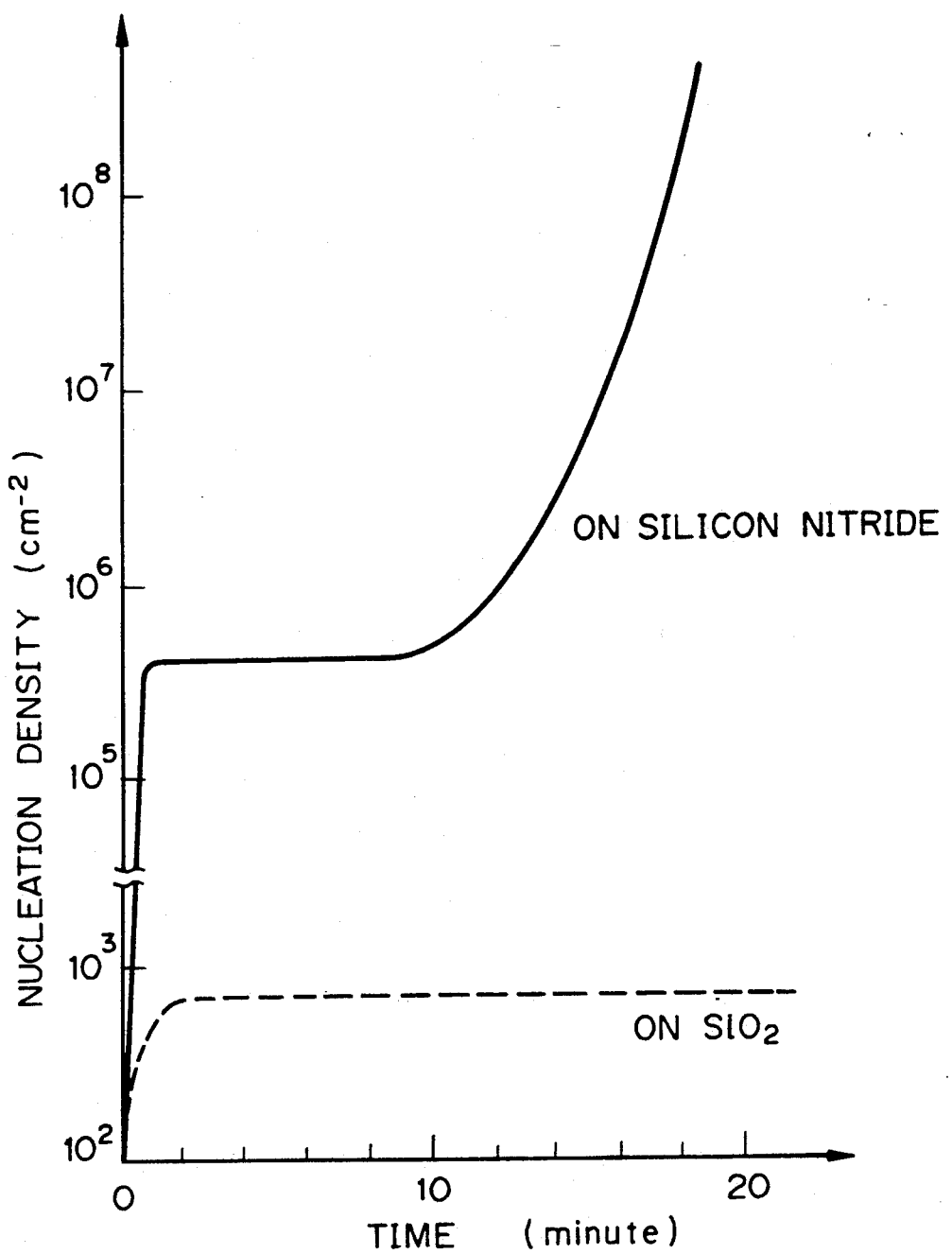
FIG. 5 is a graph showing the changes in nucleation density with lapse of time (ND) on the deposition surface of $SiO_2$ and the deposition surface of silicon nitride.

FIG. 5 is a graph showing the changes in nucleation density (ND) with lapse of time on the deposition surface of $SiO_2$ and the deposition surface of silicon nitride.

As shown in FIG. 5, soon after initiation of deposition, the nucleation density (ND) on $SiO_2$ is saturated at less than $10^3 cm^{-2}$, and its value is substantially unchanged even after 20 minutes.

In contrast, on silicon nitride ($Si_3N_4$), the density is once saturated at $4 \times 10^5 cm^{-2}$, and is not changed for 10 minutes thereafter, but will be sequentially abruptly increased. In this measurement example, there is shown the case in which $SiCl_4$ gas is diluted with $H_2$ gas, and deposited according to the CVD method under the conditions of a pressure of 175 Torr, a temperature of 1000° C. Otherwise, the same effect can be obtained by using $SiH_4$, $SiH_2Cl_2$, $SiHCl_3$, $SiF_4$, etc. as the reactive gas and controlling pressure, temperature, etc. Also, vacuum vapor deposition may be available.

In this case, although nucleation on $SiO_2$ poses substantially no problem, nucleation on $SiO_2$ can be further inhibited by addition of HCl gas in the reactive gas, whereby deposition of Si on $SiO_2$ can be made zero.

Such phenomenon owes greatly to the difference in adsorption coefficient, elimination coefficient, surface diffusion coefficient, etc. relative to Si between the material surfaces of $SiO_2$ and silicon nitride, but it may be also considered as a cause for selective deposition that $SiO_2$ itself is etched through the reaction of $SiO_2$ with Si atom itself to form silicon monooxide with high vapor pressure, while no such etching phenomenon occurs on silicon nitride (T. Yonehara, S. Yoshioka, S. Miyazawa, Journal of Applied Physics 53, 6839, 1982).

Thus, by selecting $SiO_2$ and silicon nitride as the materials on the deposition surface and selecting silicon as the material to be deposited, sufficiently great nucleation density difference ($\Delta ND$) as shown in FIG. 5 can be obtained. Here, although $SiO_2$ is desirable as the material of the deposition surface, this is not limitative but also SiOx ($0 < x < 2$) can also obtain sufficiently practical nucleation density difference.

Of course, the present invention is not limited by these materials, but the nucleation density difference ($\Delta ND$) may be sufficiently $10^3$-fold or more in terms of the density of nucleus as shown in the same graph, and sufficient selective formation of a deposited film can be performed with the materials as exemplified below.

As another method for obtaining such nucleation density difference ($\Delta ND$), a region containing excessively Si, N, etc. may be also formed by ion implantation of Si, N, etc. locally on the $SiO_2$ surface.

The present invention utilizes the selective deposition method based on such nucleation density difference ($\Delta ND$), and a deposition surface comprising a material of different kind with sufficiently greater nucleation density than the material of the deposition surface is formed sufficiently finely so that only a single nucleus may grow, whereby a single crystal is grown selectively only at the site where such fine different kind of material exists.

Since the selective growth of single crystal is determined depending on the electron state of the deposition surface, particularly the state of dangling bond, the material with lower nucleation density (e.g. $SiO_2$) is not required to be a bulk material, but it may be formed only on the surface of any desired material or substrate, etc. to form the above deposition surface.

Figure 6A:
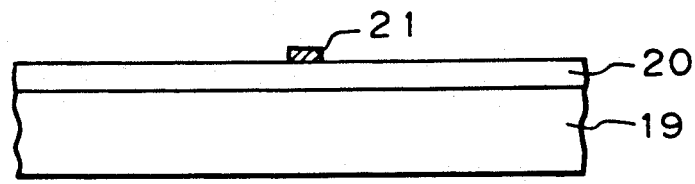
FIGS. 6(A)-6(D) are diagrams of the steps for illustration of the principle of the production process when forming practically a single crystal.
Figure 6B:
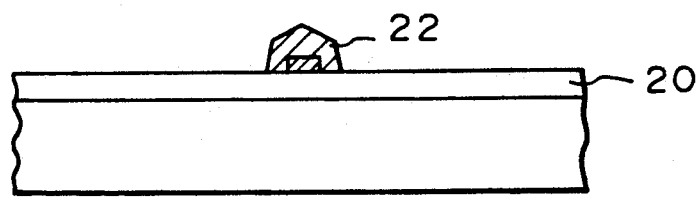
Figure 6C:
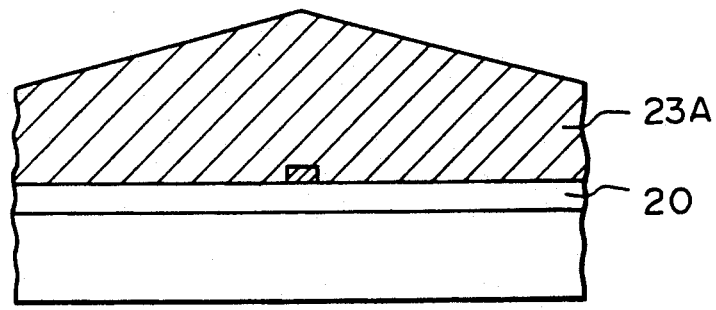
Figure 6D:
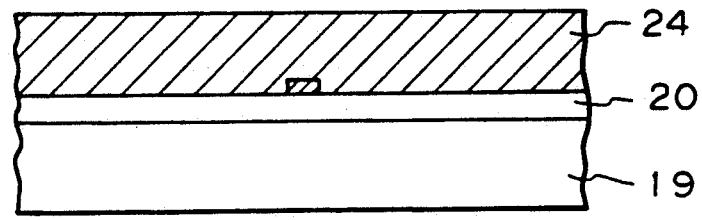
Figure 7A:
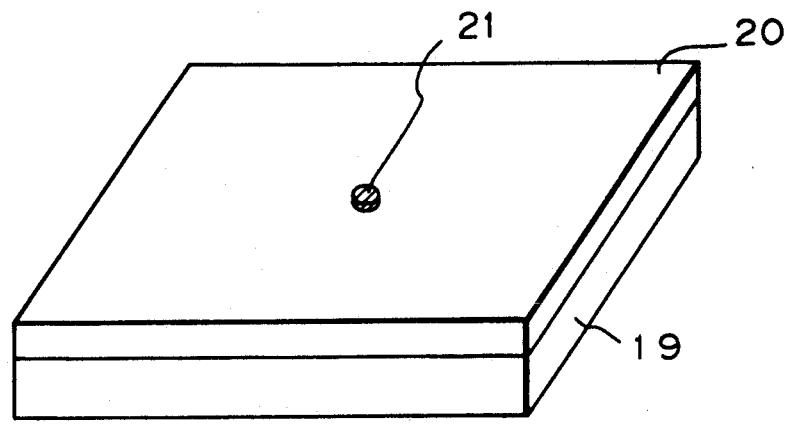
FIGS. 7(A) and 7(B) are perspective views of FIGS. 6(A) and 6(D).
Figure 7B:
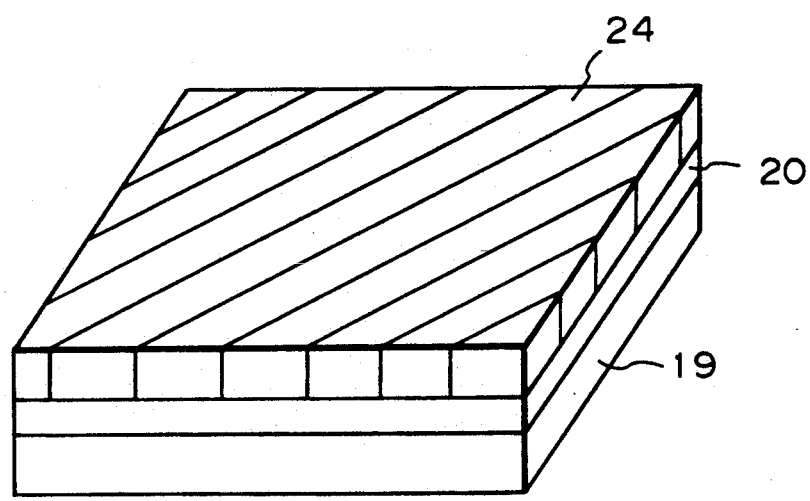

FIGS. 6(A)–6(D) illustrate diagramatically the steps for illustration of the principle of the production process when forming practically a single crystal, and FIGS. 7(A) and 7(B) are perspective views of FIGS. 6(A) and 6(D).

First, as shown in FIG. 6(A) and FIG. 7(A), on the substrate 19, a thin film with small nucleation density enabling selective nucleation [nucleation surface ($S_{NDS}$)] is formed, and a material of different kind from the material forming the thin film 20 with small nucleation density is thinly deposited thereon, followed by patterning by lithography, etc. to form sufficiently finely a nucleation surface comprising a different kind of material ($S_{NDL}$) (or called "Seed"). However, the size, the crystal structure and the composition of the substrate 19 may be as desired, and it may be also a substrate having a functional element formed thereon. Also, the nucleation surfaces ($S_{NDL}$) 21 comprising a different kind material is inclusive of modified regions having excessively Si, N, etc. formed by ion implantation of Si, N, etc. on the thin film 21, as described above.

Next, by selecting appropriate deposition conditions, a single nucleus of a thin film material is formed only on the nucleation surface ($S_{NDL}$) 21. That is, the nucleation surface ($S_{NDL}$) 21 is required to be formed sufficiently small to the extent that only a single nucleus may be formed. The size of the nucleation surface ($S_{NDL}$), which depends on the kind of the material, may be several microns or less. Further, the nucleus grows while maintaining a single crystal structure to become a single crystal grain 22 shaped in an island as shown in FIG. 6(B). For the island-shaped single crystal grain 22 to be formed, it is desirable to determine the conditions so that no nucleation may occur at all on the thin film 20.

The island-shaped single crystal grain 22 further grows while maintaining the single crystal structure with the nucleation surface ($S_{NDL}$) 21 as the center (lateral overgrowth), whereby the thin film 20 can be wholly covered therewith as shown in FIG. 6(C) (single crystal 23A).

Subsequently, the single crystal 23A is flattened by etching or polishing to form a single crystal layer 24 on the thin film 20, on which a desired element can be formed, as shown in FIG. 6(D) or FIG. 7(B).

Thus, since the thin film 20 constituting the non-nucleation surface ($S_{NDS}$) is formed on the substrate 19, any desired material can be used for the substrate 19 which is the supporting member. Further, in such case, even if the substrate 19 may be one having a functional element, etc. formed by a conventional semiconductor technique, a single crystal layer 24 can be easily formed thereon.

In the above embodiment, the non-nucleation surface ($S_{NDS}$) was formed with the thin film 21, but a substrate comprising a material with small nucleation density (ND) enabling selective nucleation may be used as such, and the single crystal layer may be formed similarly with provision of the nucleation surface ($S_{NDL}$) at any desired position.

Figure 8:
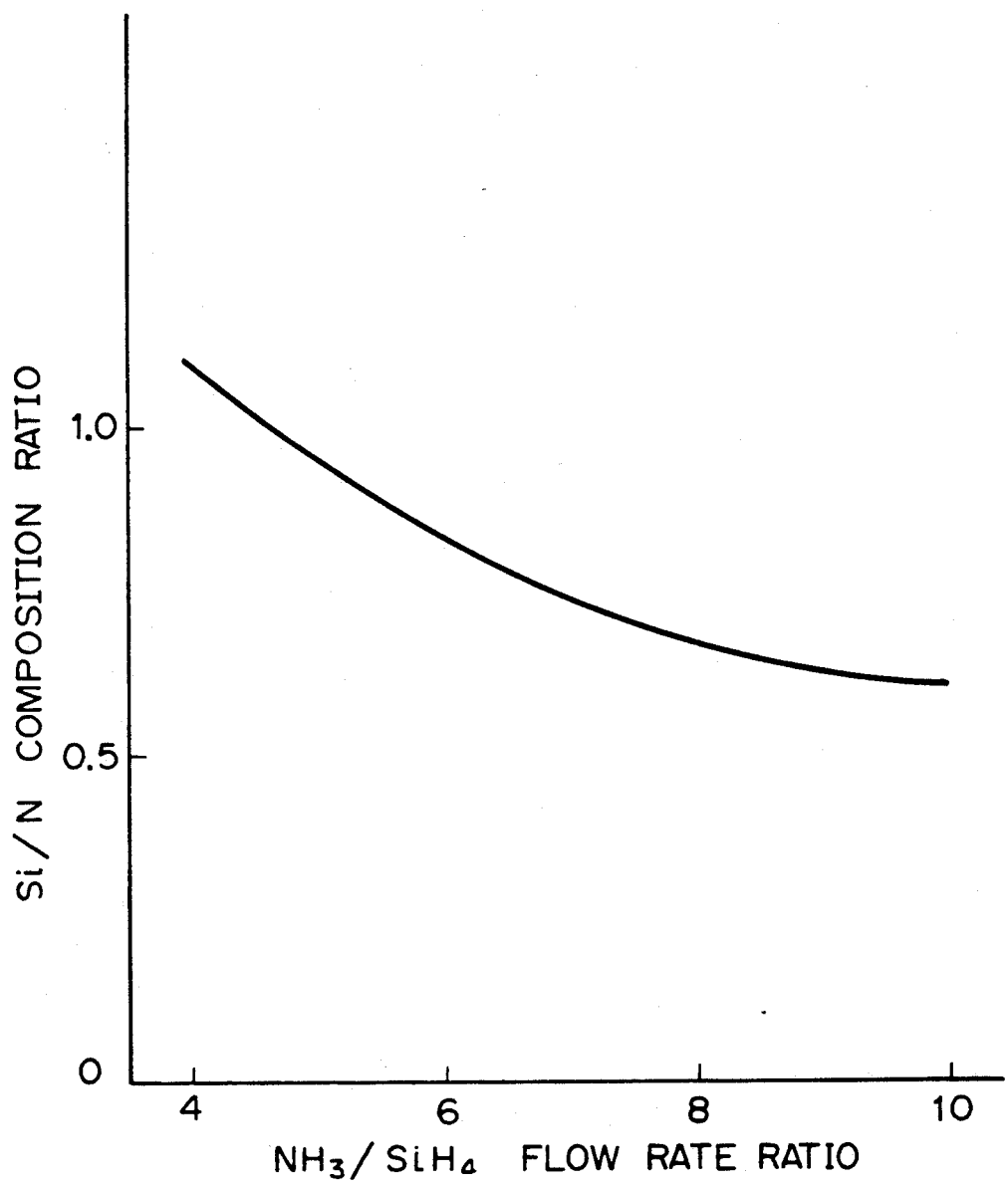
FIG. 8 is a graph showing one example of the relationship between the flow rate ratio of $NH_3$ to $SiH_4$ and the composition ratio of Si/N in the silicon nitride film formed.

FIG. 8 is a graph showing one example of the relationship between the flow rate ratio of $NH_3$ to $SiH_4$ and the composition ratio of Si/N in the silicon nitride film formed.

The deposition conditions at this time were RF output of 175 W, substrate temperature of 380° C., and the $SiH_4$ gas flow rate was fixed at 300 cc/min., with the flow rate of $NH_3$ gas being varied. As shown in the same graph, by varying the gas flow rate ratio of $NH_3/SiH_4$ from 4 to 10, the Si/N ratio in the silicon nitride film was found to vary from 11 to 1.58, as clarified by the Auger's electron spectroscopy.

Also, the composition of the silicon nitride film formed according to the reduced pressure CVD method by introducing $SiH_2Cl_2$ gas and $NH_3$ gas under the conditions of a reduced pressure of 0.3 Torr and a temperature of about 800° C., was found to be approximate to $Si_3N_4$ (Si/N=0.75) which is substantially the stoichiometric ratio.

Also, the silicon nitride film formed by heat treatment at about 1200° C. in ammonia or $N_2$ (hot nitriding method) can obtain a composition further approximate to the stoichiometric ratio, because the formation method is practiced under thermal equilibrium.

By use of the silicon nitride formed according to various methods as described above as the material for forming the nucleation surface ($S_{NDL}$) with higher nucleation density of Si than $SiO_2$, the above nucleus of Si can be permitted to grow on the nucleation surface ($S_{NDL}$) comprising silicon nitride, whereby a Si single crystal is formed based on the nucleation density difference ($\Delta ND$) corresponding to the chemical composition ratio of silicon nitride.

Figure 9:
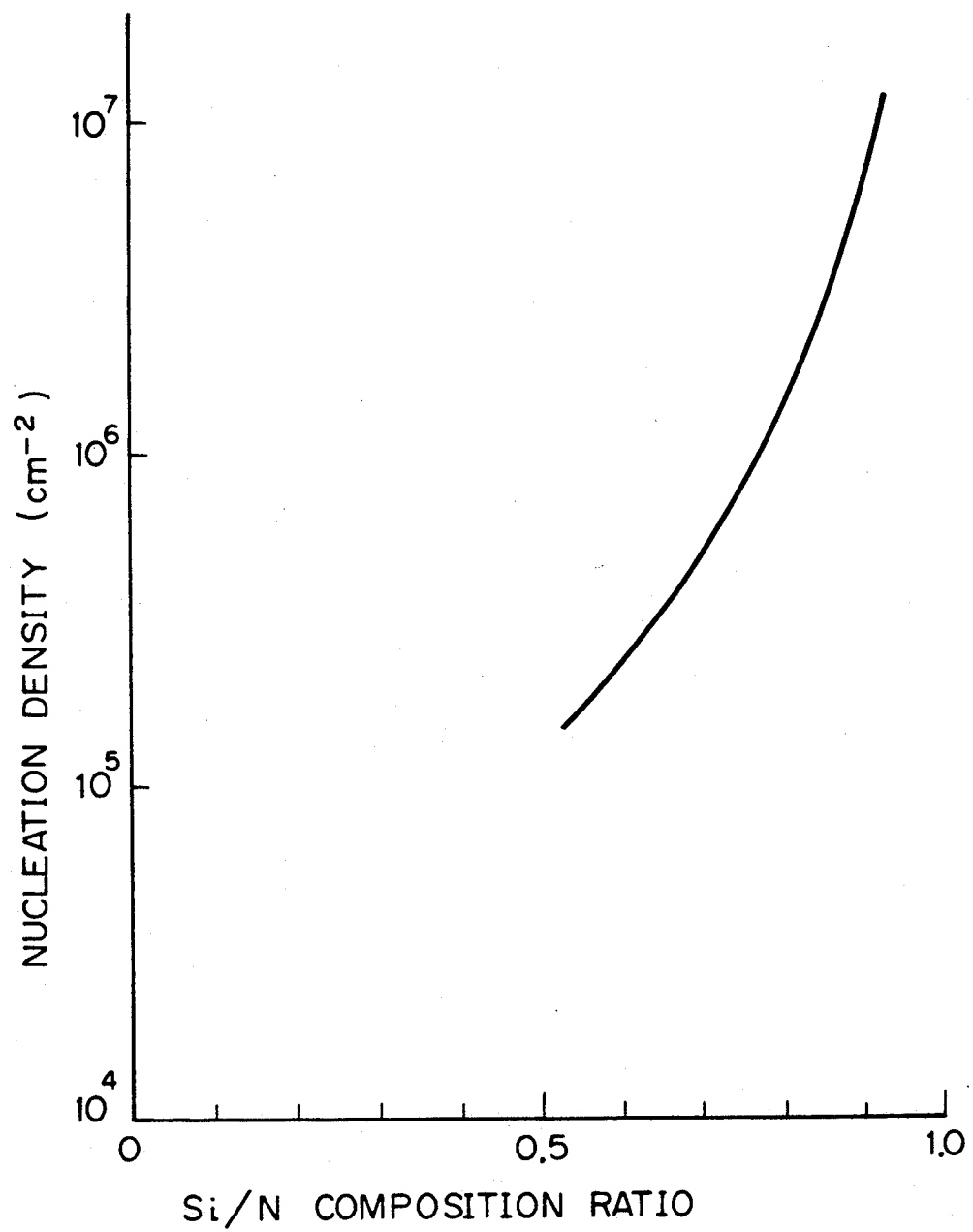
FIG. 9 is a graph showing the relationship between the Si/N composition ratio and the nucleation density (ND).

FIG. 9 is a graph showing the relationship between Si/N composition ratio and nucleation density (ND). As shown in FIG. 9, by varying the chemical composition ratio of the silicon nitride film, the nucleation density of the Si single crystalline nucleus formed thereon varies to great extent. The nucleation conditions in the graph in FIG. 9 correspond to the case when $SiCl_4$ gas is reduced to 175 Torr, and reacted with $H_2$ at 1000° C. to form Si single crystalline nuclei. Of course, another graph will be obtained if nucleation conditions such as gas species, pressure, temperature, etc. are varied.

Thus, the phenomenon of the nucleation density being varied depending on the chemical composition of silicon nitride has an influence on the size (area) of the nucleation surface ($S_{NDL}$), when silicon nitride is used as the material for forming the nucleation surface ($S_{NDL}$) which is to be formed sufficiently fine to the extent that a single crystal is permitted to grow. More specifically, when silicon nitride having a composition with large nucleation density (ND) is used, by forming the nucleation surface ($S_{NDL}$) extremely finely as compared with the case of silicon with relatively smaller nucleation density (ND) than that, only a single nucleus can be formed on the nucleation surface ($S_{NDL}$).

Such points are also applicable to other materials for forming the nucleation surface ($S_{NDL}$) as the same tendency.

Accordingly, in the present invention, for effectively accomplishing its objects, it is desirable that the nucleation density (ND) and the size of the nucleation surface ($S_{NDL}$) should be selected suitably as desired. For example, under the nucleation conditions for obtaining a nucleation density (ND) of ca. $10^5 \text{cm}^{-2}$, the size of the nucleation surface ($S_{NDL}$) may be about 4 $\mu$m or less, whereby only a single nucleus can be selectively formed.

In that case, the Si/N composition ratio is about 0.5.

As another method for realizing the nucleation density difference ($\Delta ND$) in the case of forming a Si single crystalline, a modified region with a desired size can be formed on the $SiO_2$ layer surface by ion implantation of Si, N, P, B, F, Ar, He, C, As, Ga, Ge, etc. locally on the surface of a layer comprising $SiO_2$ which is the material for forming the non-nucleation surface ($S_{NDS}$) with small nucleation density to make the modified region the nucleation surface with larger nucleation density (ND) ($S_{NDL}$).

For example, the $SiO_2$ surface may be covered with a resist, and the desired sites are exposed, developed and dissolved to have the $SiO_2$ surface exposed partially.

Subsequently, by use of $SiF_4$ gas as the source gas, Si ions are implanted at 10 keV at a density of $1 \times 10^{16}$ to $1 \times 10^{18} \text{cm}^{-2}$.

The projection flight length in this case is 114 Å, and the Si concentration reaches ca. $10^{22} \text{cm}^{-3}$ on the $SiO_2$ surface. Since $SiO_2$ layer is originally amorphous, the modified region implanted with Si ions to be made Si excessive is also amorphous.

For formation of a modified region, ion implantation can be effected with a resist as the mask, but narrowed Si ions may be also implanted onto the desired position within the desired area on the $SiO_2$ surface without use of a resist mask by use of the converged ion beam technique.

After ion implantation is thus effected, the resist can be peeled off to form a modified region with excessive Si on the SiO$_2$ surface at the desired position with a desired size. On the SiO$_2$ deposition surface having such modified region formed thereon, Si single crystal is permitted to grow in gas phase.

Figure 10:
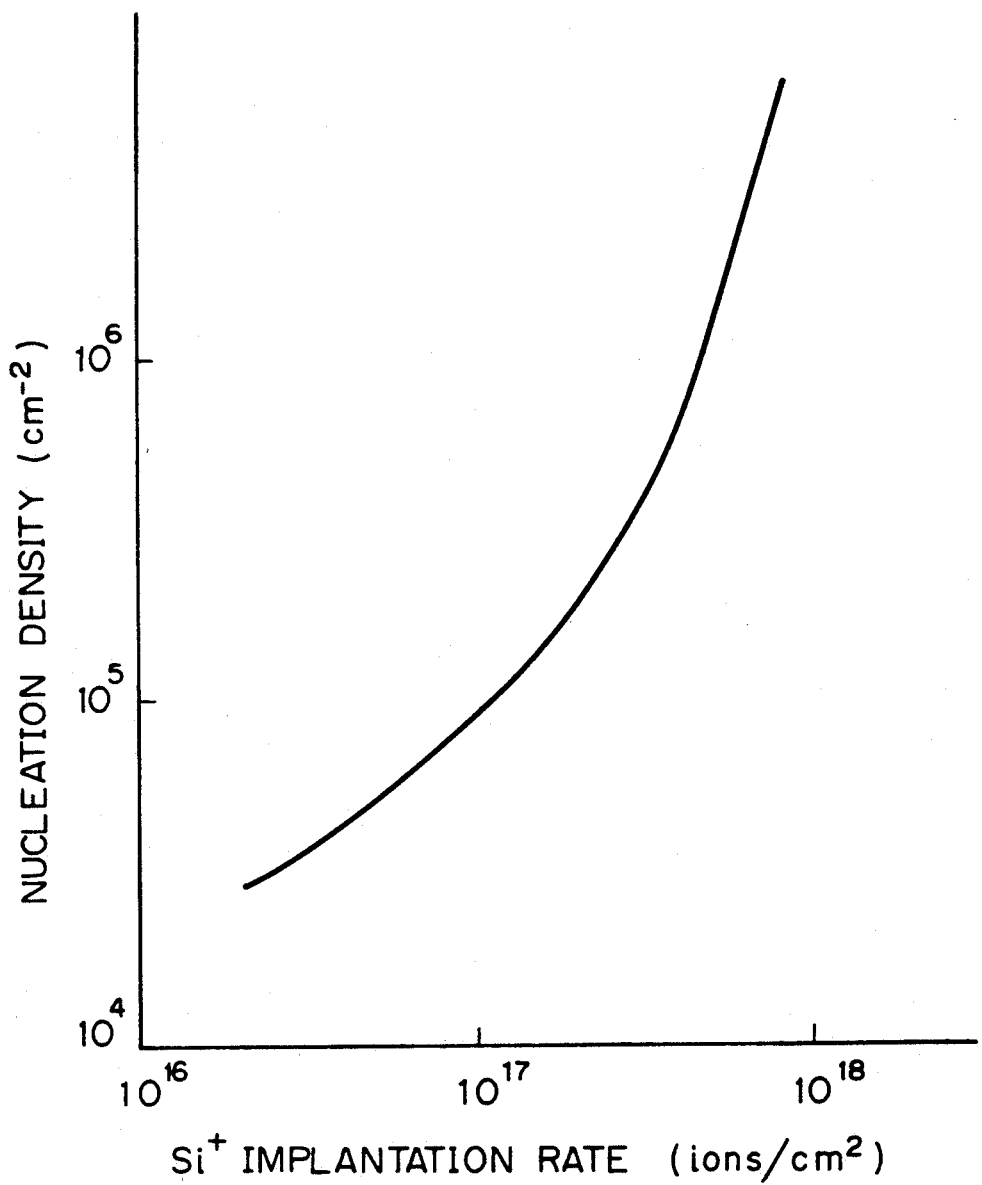
FIG. 10 is a graph showing the relationship between the Si ion implantation rate and the nucleation density (ND).

FIG. 10 is a graph showing the relationship between Si ion implantation rate and nucleation density.

As shown in FIG. 10, it can be understood that nucleation density (ND) is increased as the amount of Si$^+$ implanted is larger.

Accordingly, by forming sufficiently finely the modified region, only a single nucleus of Si can be grown with the modified region as the nucleation surface (S$_{NDL}$), whereby a single crystal can be grown as described above.

Sufficiently fine formation of the modified region to the extent that a single nucleus can grow can be accomplished easily by patterning of a resist or narrowing of the beam of the converged ion beam.

For growth of a single crystal by selective nucleation of Si, the CVD method is not limitative, but it is also possible to use the method in which Si is evaporated by an electron gun in vacuum ($<10^{-6}$ Torr) to be deposited on a heated substrate. Particularly, according to the MBE (Molecular Beam Epitaxy) method in which vapor deposition is effected in ultra-high vacuum ($<10^{-9}$ Torr), it has been known in the art that the reaction begins between Si beam and SiO$_2$ at a substrate temperature of 900° C. or higher, whereby nucleation of Si becomes zero on SiO$_2$ (T. Yonehara, S. Yoshioka and S. Miyazawa, Journal of Applied Physics 53, 10, p6839, 1983).

By utilizing this phenomenon, a single nucleus can be formed on the fine silicon nitride existing in spots on SiO$_2$ with complete selectivity and single crystalline Si can be grown therefrom. The single crystal growth conditions as a suitable example at this time are vacuum degree of 10$^{-8}$ Torr or less, Si beam intensity of 9.7$\times$10$^{14}$ atoms/cm$^2$ sec, substrate temperature of 900° C. to 1000° C.

In this case, through the reaction SiO$_2$+Si$\rightarrow$2SiO $\uparrow$, a reaction product with remarkably high vapor pressure of SiO is formed, whereby etching of SiO$_2$ itself with Si through such evaporation occurs.

In contrast, on silicon nitride, no such etching phenomenon occurs, but nucleation of Si single crystal, and growth of single crystal occurs.

Therefore, as the material with higher nucleation density (ND) for forming the nucleation surface (S$_{NDL}$), other than silicon nitride, tantalum oxide (Ta$_2$O$_5$), silicon nitride oxide (SiON), etc. can be also used to obtain the same effect. Thus, by forming these materials with a small area to form the above nucleation surface (S$_{NDL}$), single crystals of Si can be similarly grown.

What is claimed is:

1. A process for producing a Si crystal article on a glass substrate comprising the steps of:

forming a silicon nitride film on the glass substrate;

forming a film comprising SiO$_2$ on the silicon nitride film;

selectively etching the film comprising SiO$_2$ to form a concavity surrounded by side walls of the remaining portion of the film comprising SiO$_2$;

thermally oxidizing the silicon nitride film to form another film comprising SiO$_2$ on the surface of the silicon nitride film and to anneal the side walls, thereby densifying the side walls;

forming an opening in said another film comprising SiO$_2$ so as to expose a portion of the silicon nitride film in an area sufficiently small such that only a single nucleus from which a Si single-crystal is grown is formed in said opening;

applying vapor deposition to form said Si single-crystal in said concavity from the single nucleus on the silicon nitride film; and flattening the surface of the Si single-crystal by removing a part thereof.

* * * * *